United States Patent
Park et al.

(10) Patent No.: US 10,510,898 B2
(45) Date of Patent: Dec. 17, 2019

(54) THIN FILM TRANSISTOR AND MANUFACTURING METHOD THEREFOR

(71) Applicant: IUCF-HYU (INDUSTRY-UNIVERSITY COOPERATION FOUNDATION HANYANG UNIVERSITY), Seoul (KR)

(72) Inventors: Jin-Seong Park, Seongnam-si (KR); Kyungchul Ok, Anyang-si (KR); Hyunjun Jeong, Goyang-si (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 15/459,699

(22) Filed: Mar. 15, 2017

(65) Prior Publication Data

US 2017/0186877 A1    Jun. 29, 2017

Related U.S. Application Data

(63) Continuation of application No. PCT/KR2015/009644, filed on Sep. 14, 2015.

(30) Foreign Application Priority Data

Sep. 16, 2014 (KR) .................. 10-2014-0122957

(51) Int. Cl.
  *H01L 29/78* (2006.01)
  *H01L 29/66* (2006.01)
  *H01L 29/786* (2006.01)

(52) U.S. Cl.
  CPC .. *H01L 29/78606* (2013.01); *H01L 29/66969* (2013.01); *H01L 29/7869* (2013.01); *H01L 29/78696* (2013.01)

(58) Field of Classification Search
  CPC .................. H01L 29/66; H01L 29/78696
  (Continued)

(56) References Cited

U.S. PATENT DOCUMENTS

| 8,119,465 B1* | 2/2012 | Lin ............... H01L 29/7869 |
|---|---|---|
| | | 257/E21.37 |
| 2006/0127817 A1* | 6/2006 | Ramanujan ....... H01L 29/66765 |
| | | 430/320 |

(Continued)

FOREIGN PATENT DOCUMENTS

| JP | 2002-289859 A | 10/2002 | |
|---|---|---|---|
| JP | 2002289859 A | * 10/2002 | ......... H01L 29/7869 |

(Continued)

OTHER PUBLICATIONS

English Traslation of JP 2002289859 A.*
International Search Report for PCT/KR2015/009644 dated Jan. 20, 2016 [PCT/ISA/210].

*Primary Examiner* — Sheikh Maruf
(74) *Attorney, Agent, or Firm* — Sughrue Mion, PLLC

(57) ABSTRACT

A thin film transistor is provided. The thin film transistor includes a substrate, an active pattern disposed on the substrate and including a nitride, a protective pattern disposed on the active pattern and including a non-nitride, a gate electrode overlapping with the active pattern, and a gate insulating layer between the gate electrode and the active pattern.

8 Claims, 9 Drawing Sheets

(58) Field of Classification Search
USPC .......................................................... 257/43
See application file for complete search history.

(56) References Cited

U.S. PATENT DOCUMENTS

| | | | | |
|---|---|---|---|---|
| 2008/0258143 A1* | 10/2008 | Kim | ...................... | H01L 29/458 257/43 |
| 2009/0230390 A1* | 9/2009 | Gosain | ................ | H01L 29/4908 257/43 |
| 2009/0250693 A1* | 10/2009 | Jeong | .................. | H01L 27/1225 257/43 |
| 2010/0001272 A1* | 1/2010 | Ye | ...................... | H01L 21/02521 257/57 |
| 2010/0051933 A1* | 3/2010 | Kim | .................... | H01L 27/1225 257/43 |
| 2010/0102311 A1* | 4/2010 | Ito | ...................... | H01L 27/1225 257/43 |
| 2010/0148169 A1* | 6/2010 | Kim | ........................ | H01L 27/12 257/43 |
| 2010/0163863 A1* | 7/2010 | Yaegashi | ............. | H01L 29/7869 257/43 |
| 2010/0176399 A1* | 7/2010 | Takeguchi | .......... | H01L 29/4908 257/57 |
| 2010/0181565 A1* | 7/2010 | Sakata | ................... | C23C 14/086 257/43 |
| 2010/0219410 A1* | 9/2010 | Godo | ................. | H01L 29/78693 257/43 |
| 2010/0244029 A1* | 9/2010 | Yamazaki | ........... | H01L 27/1225 257/52 |
| 2010/0252832 A1* | 10/2010 | Asano | ................. | H01L 27/1214 257/57 |
| 2010/0276686 A1* | 11/2010 | Lee | ..................... | H01L 27/1214 257/43 |
| 2010/0295042 A1* | 11/2010 | Yano | .................. | H01L 29/7869 257/43 |
| 2011/0003429 A1* | 1/2011 | Oikawa | ............... | H01L 29/7869 438/104 |
| 2011/0090186 A1* | 4/2011 | Yamazaki | .............. | G09G 3/344 345/204 |
| 2011/0108832 A1* | 5/2011 | Bae | ......................... | H01L 27/12 257/43 |
| 2011/0157509 A1* | 6/2011 | Kim | .................. | G02F 1/136209 349/47 |
| 2012/0061661 A1 | 3/2012 | Liu et al. | | |
| 2012/0175611 A1* | 7/2012 | Kirita | .................. | H01L 29/7869 257/43 |
| 2012/0187407 A1* | 7/2012 | Choi | ....................... | H01L 29/45 257/60 |
| 2013/0017648 A1* | 1/2013 | Yim | ....................... | H01L 29/45 438/104 |
| 2013/0181212 A1* | 7/2013 | Kim | .................. | H01L 21/02554 257/43 |
| 2013/0327095 A1* | 12/2013 | Muller | .................... | C03C 17/22 65/104 |
| 2014/0042429 A1* | 2/2014 | Park | .................. | H01L 29/66742 257/43 |
| 2014/0084286 A1* | 3/2014 | Jeon | .................... | H01L 33/0041 257/43 |
| 2014/0125901 A1* | 5/2014 | Tong | ...................... | G02F 1/1368 349/43 |
| 2014/0361287 A1* | 12/2014 | Shieh | .................. | H01L 29/7869 257/43 |
| 2015/0014677 A1* | 1/2015 | Jo | ....................... | H01L 29/7869 257/43 |
| 2015/0097179 A1* | 4/2015 | Kim | .................... | H01L 27/1225 257/43 |
| 2015/0311345 A1* | 10/2015 | Zhao | ................... | H01L 29/7869 257/43 |
| 2016/0043227 A1* | 2/2016 | Zhang | ................ | H01L 29/7869 257/43 |
| 2018/0342623 A1* | 11/2018 | Chin | ................. | H01L 29/7869 |

FOREIGN PATENT DOCUMENTS

| | | |
|---|---|---|
| JP | 2010-186994 A | 8/2010 |
| JP | 10-2011-0084005 A | 7/2011 |
| KR | 10-2013-0127150 A | 11/2013 |

\* cited by examiner

[Fig. 1a]
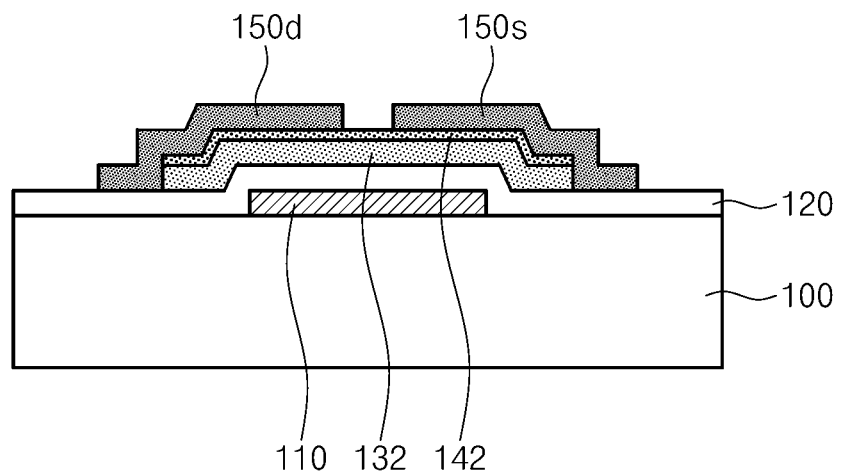
[Fig. 1b]
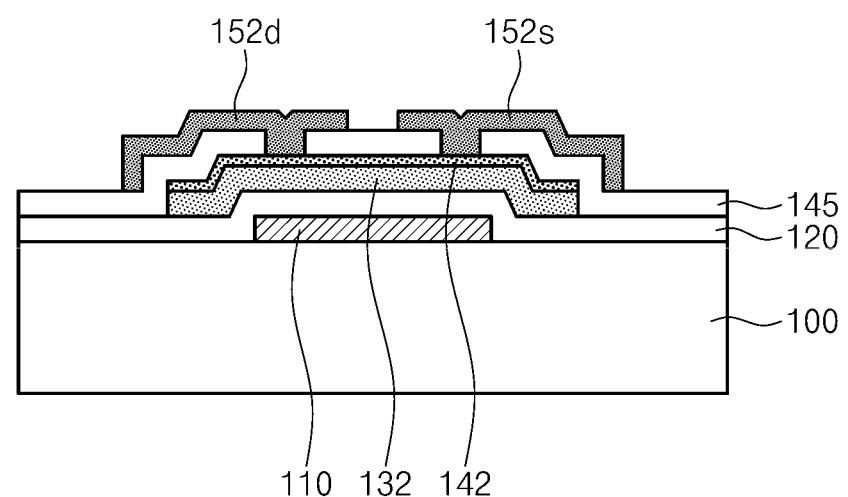

[Fig. 2]
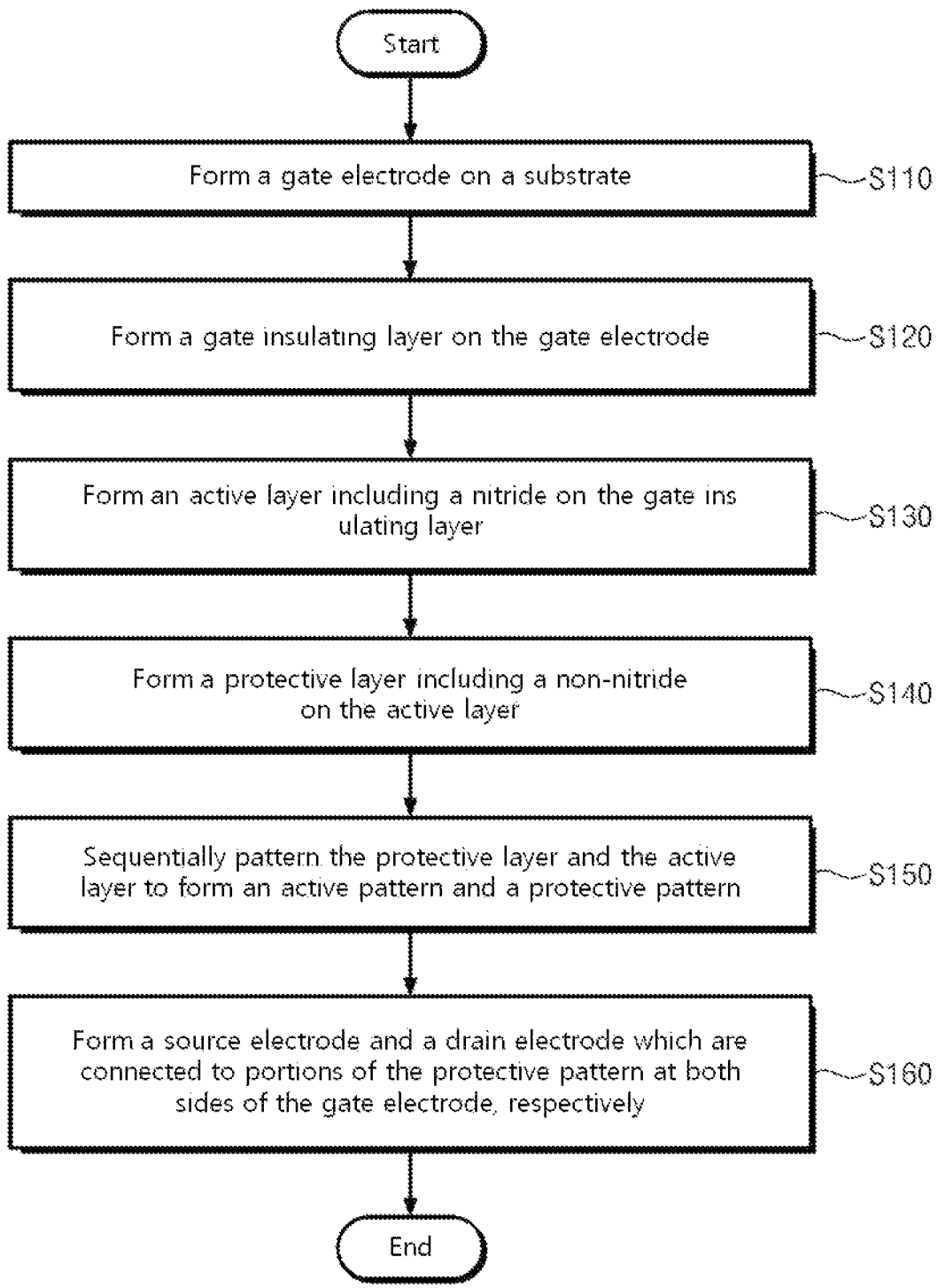

[Fig. 3]
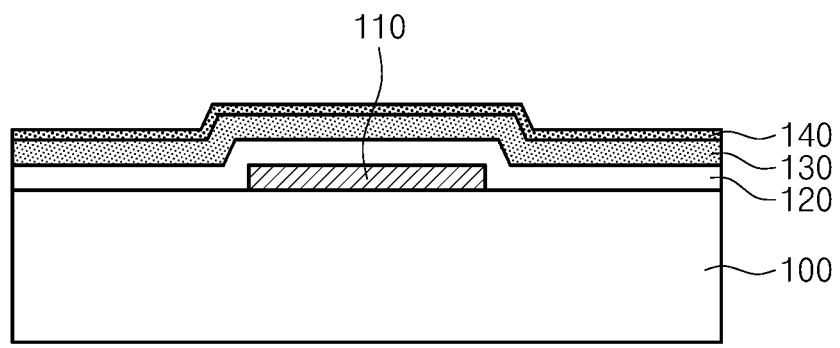
[Fig. 4]
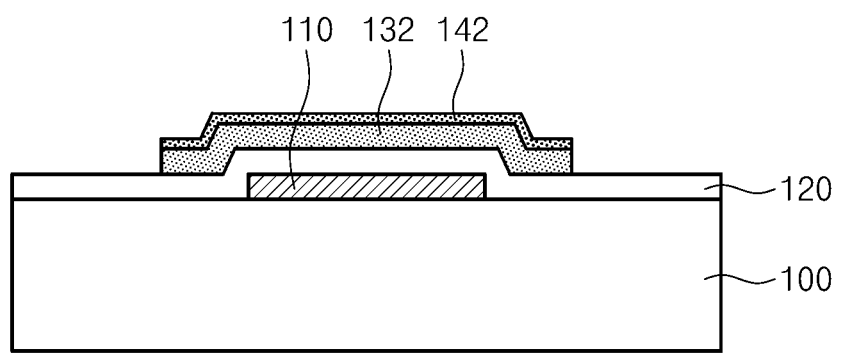

[Fig. 5]
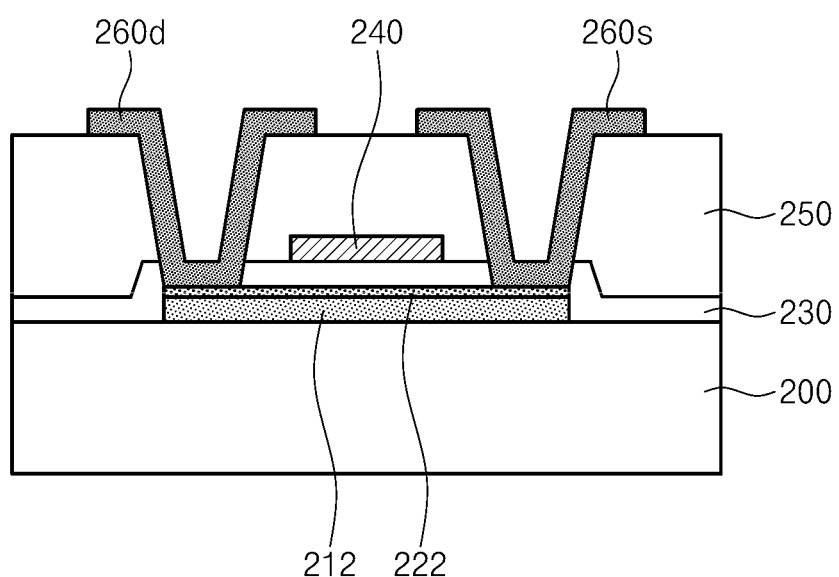

[Fig. 6]
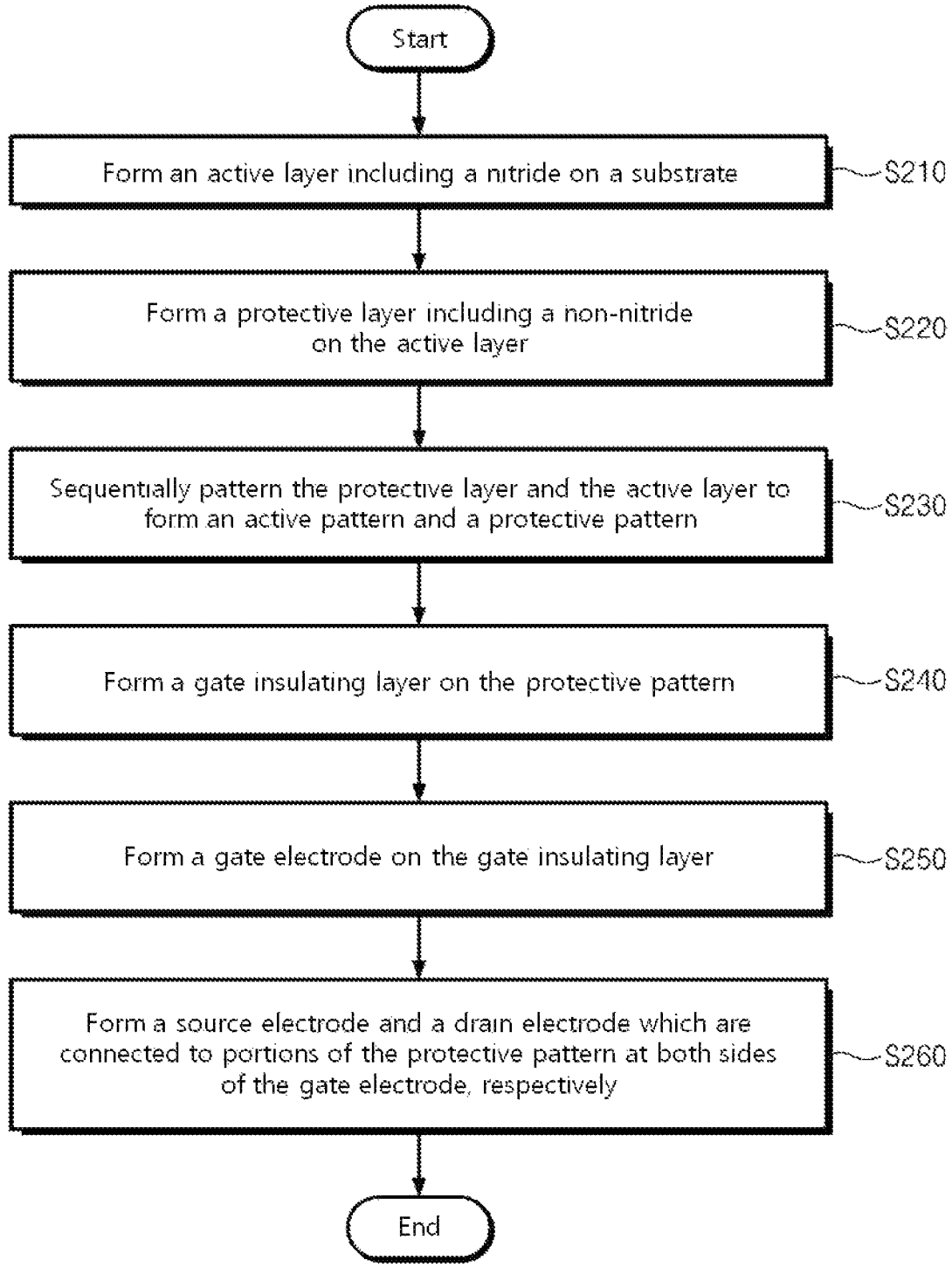

[Fig. 7]
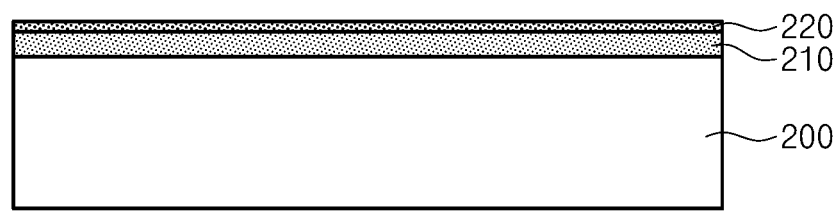
[Fig. 8]
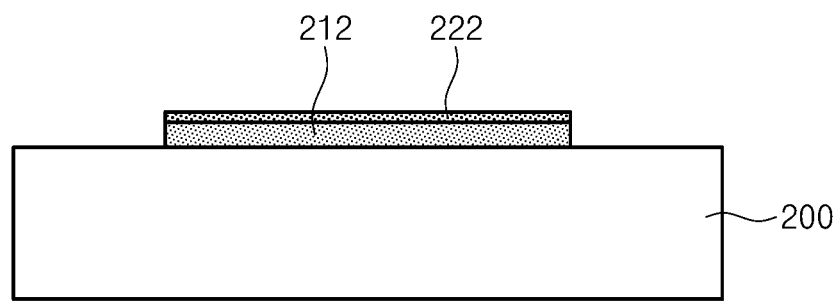

[Fig. 9]
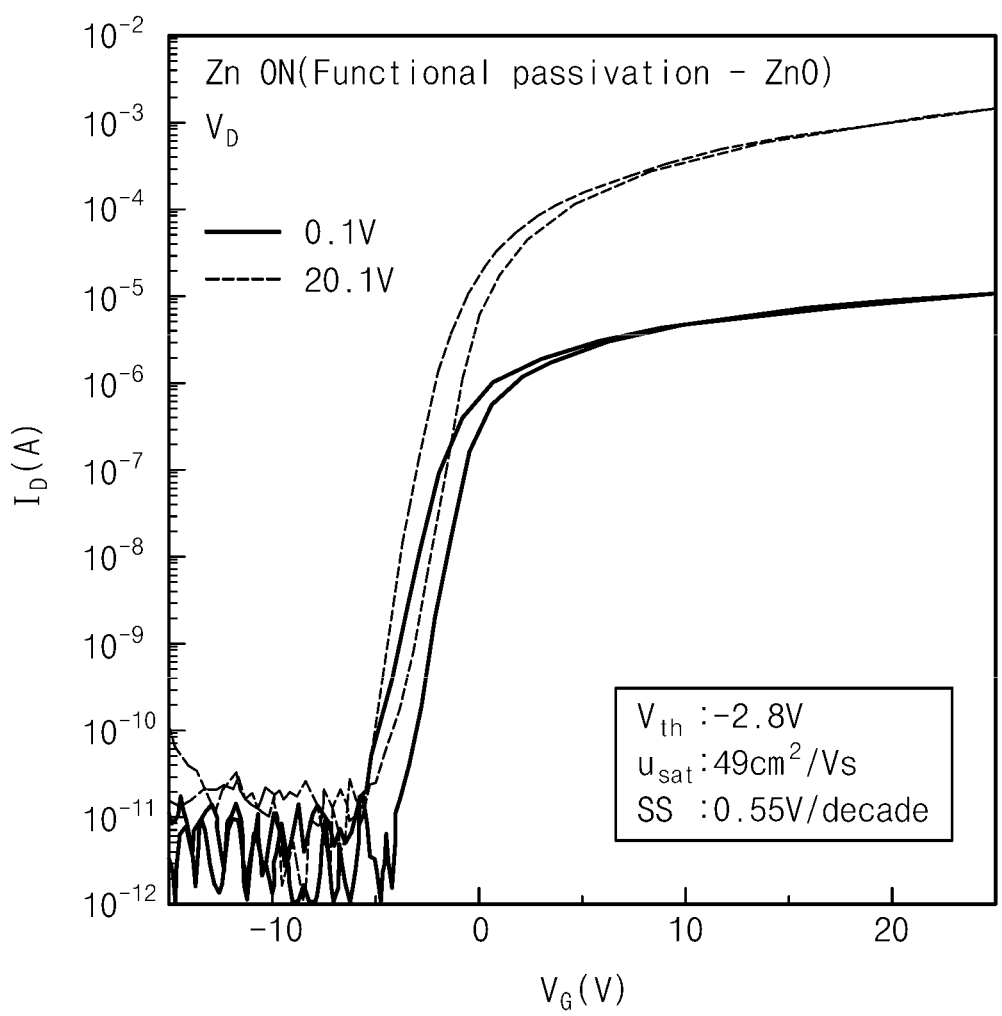

【Fig. 10】
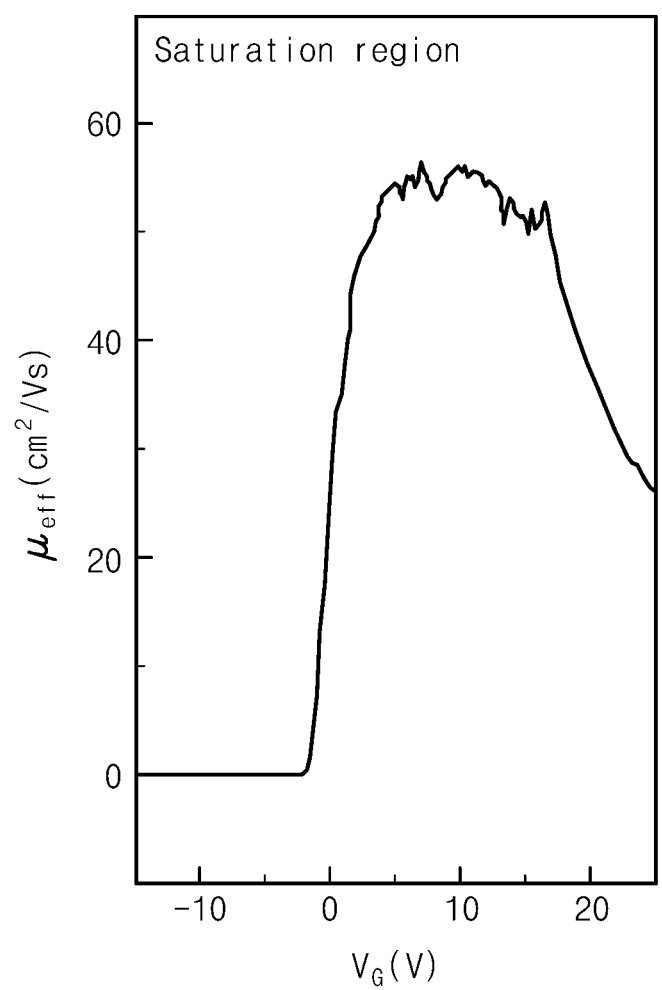

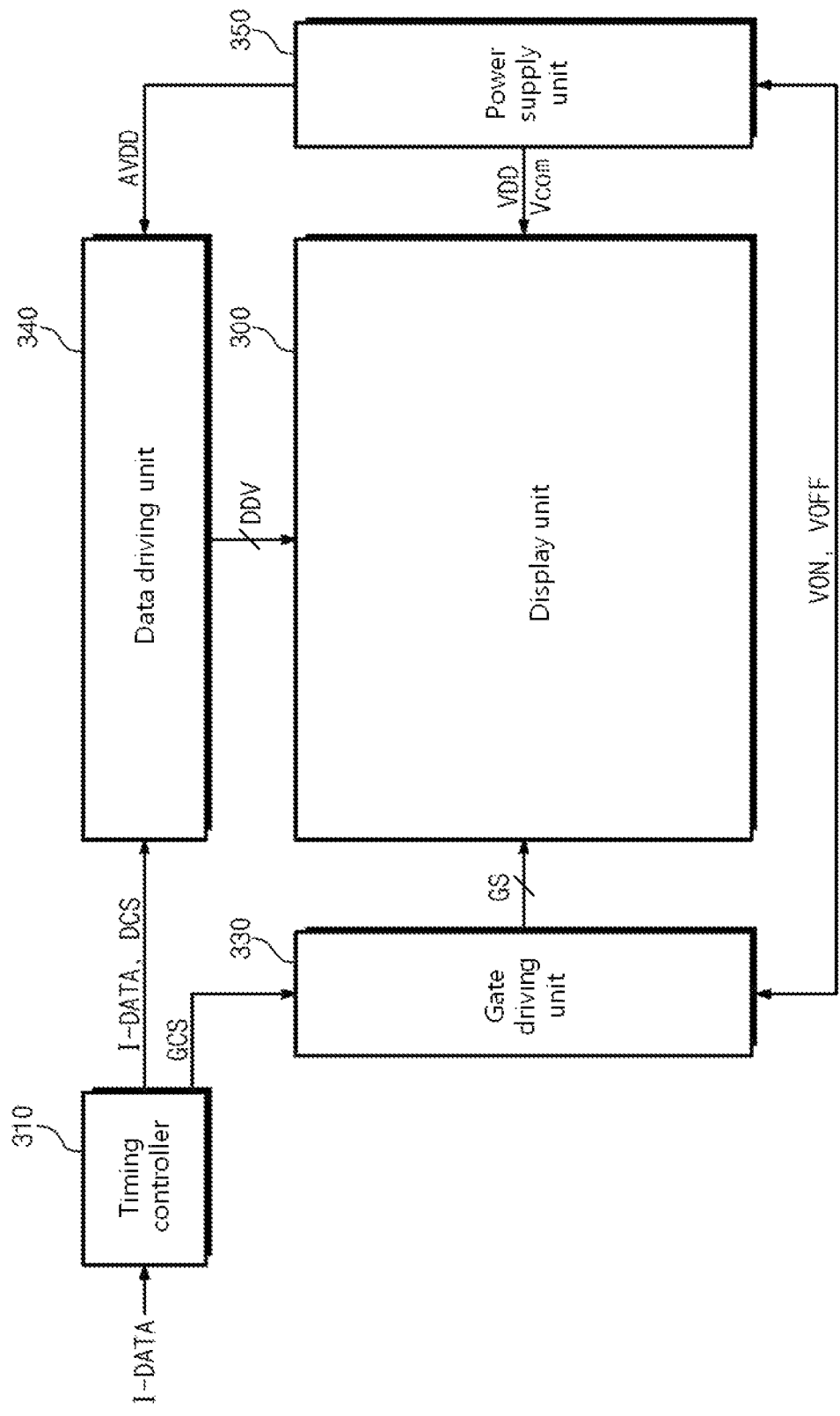
[Fig. 11]

THIN FILM TRANSISTOR AND MANUFACTURING METHOD THEREFOR

CROSS-REFERENCE TO RELATED APPLICATION

This application is a continuation of pending International Application Ser. No. PCT/KR2015/009644, which was filed on Sep. 14, 2015 and claims priority to Korean Patent Application No. 10-2014-0122957, filed on Sep. 16, 2014, in the Korean Intellectual Property Office, the disclosures of which are hereby incorporated by reference in their entireties.

BACKGROUND

1. Field

Embodiments of the inventive concepts relate to a thin film transistor and a method of fabricating the same and, more particularly, to a thin film transistor including an active pattern formed of a nitride and a protective pattern formed of a non-nitride on the active pattern and a method of fabricating the same.

2. Description of the Related Art

Recently, large-area, ultra high definition (UHD) and high-speed display devices have been demanded and flexible display devices applicable to wearable devices have been demanded. Since a conventional amorphous silicon thin film transistor has a low mobility (0.5 cm$^2$/Vs or less), it is not suitable for the large-area and UHD display devices and the flexible display devices.

Organic thin film transistors and oxide thin film transistors have been studied in order to solve these problems. For example, Korean Patent Publication No. 10-2011-0095530 (Application No. 10-2010-0015052) discloses an organic thin film transistor that include a gate insulating layer having a recess region in an upper portion thereof and an organic semiconductor layer disposed in the recess region of the gate insulating layer in order to reduce an operation voltage and to simplify fabricating processes.

For another example, in order to prevent a signal delay in a large-area display device, Korean Patent Publication No. 10-2008-0054941 (Application No. 10-2006-0127671) discloses a source/drain electrode that is formed of a first conductive layer and a second conductive layer having a low resistance to reduce a contact resistance between a compound semiconductor layer and the source/drain electrode.

SUMMARY

Embodiments of the inventive concepts may provide a highly reliable thin film transistor and a method of fabricating the same.

Embodiments of the inventive concepts may also provide a thin film transistor with a high mobility and a method of fabricating the same.

Embodiments of the inventive concepts may further provide a thin film transistor capable of improving a yield and a method of fabricating the same.

In an aspect, a thin film transistor may include a substrate, an active pattern disposed on the substrate and including a nitride, a protective pattern disposed on the active pattern and including a non-nitride, a gate electrode overlapping with the active pattern, and a gate insulating layer between the gate electrode and the active pattern.

In some embodiments, the protective pattern may be formed of a semiconductive non-nitride, and the active pattern may have a higher mobility than the protective pattern.

In some embodiments, the thin film transistor may further include a passivation layer covering the protective pattern, a source electrode penetrating the passivation layer so as to be in contact with a portion of the protective pattern adjacent to a side of the gate electrode, and a drain electrode penetrating the passivation layer so as to be in contact with a portion of the protective pattern adjacent to another side of the gate electrode.

In some embodiments, the thin film transistor may further include a source electrode at a side of the gate electrode, and a drain electrode at another side of the gate electrode. The source electrode and the drain electrode may be in contact with portions of the protective pattern adjacent to the side and the another side of the gate electrode, respectively.

In some embodiments, the active pattern may be disposed between the protective pattern and the gate electrode.

In some embodiments, the protective pattern may be disposed between the active pattern and the gate electrode.

In some embodiments, the active pattern may be formed of a compound of a first element, a second element, and nitrogen, and the protective pattern may be formed of a compound of the first element and the second element.

In some embodiments, the first element may include zinc (Zn) and the second element may include oxygen (O).

In some embodiments, a thickness of the protective pattern may be smaller than a thickness of the active pattern.

In some embodiments, the protective pattern may be in direct contact with the active pattern.

In another aspect, a method of fabricating a thin film transistor may include forming an active layer including a nitride on a substrate, forming a protective layer including a non-nitride on the active layer, and sequentially patterning the protective layer and the active layer to form an active pattern and a protective pattern sequentially stacked on the substrate. The protective layer may protect the active layer from a solution process for patterning the active layer.

In some embodiments, the active layer may be formed using a first source including a first element, a second source including a second element, and a third source including nitrogen, and the protective layer may be formed using the first source and the second source by the same formation method as a formation method of the active layer.

In some embodiments, the method may further include forming a gate electrode on the substrate before the forming of the active layer, and forming a gate insulating layer on the gate electrode.

In some embodiments, the method may further include forming a gate insulating layer on the protective pattern after the forming of the active layer, and forming a gate electrode on the gate insulating layer.

In still another aspect, a method of fabricating a thin film transistor may include forming an active layer including a metal oxynitride on a substrate, forming a protective layer including a metal oxide on the active layer, the protective layer having a smaller thickness than the active layer, the protective layer having a lower mobility than the active layer, and sequentially patterning the protective layer and the active layer by using a solution process. The protective layer may protect the active layer from the solution process.

In some embodiments, the active layer and the protective layer may be formed using the same process, and a metal included in the active layer may be the same as a metal included in the protective layer.

In some embodiments, the patterning of the protective layer and the active layer may include forming a photoresist pattern on the protective layer and the active layer. The protective layer may protect the active layer from the solution process of developing the photoresist pattern.

In some embodiments, the patterning of the protective layer and the active layer may include forming a photoresist pattern on the protective layer and the active layer. The protective layer may prevent the active layer from being over-etched by the solution process of etching the protective layer and the active layer by using the photoresist pattern as a mask.

In some embodiments, the active layer may include zinc oxynitride, and the protective layer may include zinc oxide.

In some embodiments, the protective layer may be formed of a semiconductive metal oxide.

In some embodiments, the method may further include forming a gate electrode spaced apart from the active layer. A channel may be generated in the active layer and is not generated in the protective layer when a voltage is applied to the gate electrode.

BRIEF DESCRIPTION OF THE DRAWINGS

FIG. 1A is a cross-sectional view illustrating a thin film transistor according to some embodiments of the inventive concepts.

FIG. 1B is a cross-sectional view illustrating a thin film transistor according to a modified example of some embodiments of the inventive concepts.

FIG. 2 is a flow chart illustrating a method of fabricating a thin film transistor according to some embodiments of the inventive concepts.

FIGS. 3 and 4 are cross-sectional views illustrating a method of fabricating a thin film transistor according to some embodiments of the inventive concepts.

FIG. 5 is a cross-sectional view illustrating a thin film transistor according to other embodiments of the inventive concepts.

FIG. 6 is a flow chart illustrating a method of fabricating a thin film transistor according to other embodiments of the inventive concepts.

FIGS. 7 and 8 are cross-sectional views illustrating a method of fabricating a thin film transistor according to other embodiments of the inventive concepts.

FIG. 9 is a graph illustrating a current-voltage characteristic of a thin film transistor according to embodiments of the inventive concepts.

FIG. 10 is a graph illustrating a mobility of a thin film transistor according to embodiments of the inventive concepts.

FIG. 11 is a schematic block diagram illustrating a display device including a thin film transistor according to embodiments of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1A is a cross-sectional view illustrating a thin film transistor according to some embodiments of the inventive concepts.

Referring to FIG. 1A, a thin film transistor according to some embodiments of the inventive concepts may include a gate electrode 110, a gate insulating layer 120, an active pattern 132, a protective pattern 142, a drain electrode 150d, and a source electrode 150s, which are disposed on a substrate 100.

The substrate 100 may be a glass substrate. Alternatively, the substrate 100 may be a plastic substrate, a silicon substrate, or a compound semiconductor substrate. The substrate 100 may be flexible.

The gate electrode 110 may be disposed on the substrate 100. The gate electrode 110 may be formed of a metal. For example, the gate electrode 110 may be formed of at least one of nickel (Ni), chromium (Cr), molybdenum (Mo), aluminum (Al), titanium (Ti), copper (Cu), tungsten (W), or any alloy thereof. The gate electrode 110 may be formed of a single layer or multi-layer using the metal. For example, the gate electrode 110 may be formed of a triple layer of molybdenum (Mo), aluminum (Al), and molybdenum (Mo) sequentially stacked, or a double layer of titanium (Ti) and copper (Cu) sequentially stacked. For another example, the gate electrode 110 may be formed of a single layer of an alloy of titanium (Ti) and copper (Cu). Alternatively, the gate electrode 110 may be formed of a transparent conductive material.

The gate insulating layer 120 may be disposed on the gate electrode 110. The gate insulating layer 120 may be formed of at least one of silicon oxide, silicon nitride, silicon oxynitride, or a high-k dielectric material such as a metal oxide (e.g., aluminum oxide or hafnium oxide).

The active pattern 132 may be disposed on the gate insulating layer 120. The active pattern 132 may be spaced apart from and overlap with the gate electrode 110 with the gate insulating layer 120 interposed therebetween.

The active pattern 132 may be formed of a nitride. In some embodiments, the active pattern 132 may be formed of a compound including a first element, a second element, and nitrogen. For example, in a case in which the first element includes a metal (e.g., zinc (Zn), tin (Sn), indium (In), or titanium (Ti)) and the second element includes oxygen (O), the active pattern 132 may be formed of a metal oxynitride (e.g., ZnON, SnON, InON, or TiON).

In the above case in which the active pattern 132 according to some embodiments is formed of the compound of nitrogen and the metal, an effective mass of the active pattern 132 may be reduced by combination of the metal and nitrogen. Thus, the active pattern 132 may have a high mobility.

The protective pattern 142 may be disposed on the active pattern 132. Thus, the active pattern 132 may be disposed between the protective pattern 142 and the gate electrode 110. A thickness of the protective pattern 142 may be smaller than a thickness of the active pattern 132.

The protective pattern 142 may be formed of a different material from the active pattern 132. In some embodiments, the protective pattern 142 may be formed of a semiconductive non-nitride. When the active pattern 132 is formed of the compound including the first element, the second element, and nitrogen as described above, the protective pattern 142 may be formed of a compound of the first element and the second element. For example, when the first element includes the metal (e.g., zinc (Zn)) and the second element includes oxygen (O) as described above, the active pattern 132 may include ZnON and the protective pattern 142 may include ZnO.

The source electrode 150s may be connected to a portion of the protective pattern 142, which is adjacent to a side of the gate electrode 110. The drain electrode 150d may be connected to a portion of the protective pattern 142, which is adjacent to another side of the gate electrode 110. In some embodiments, the source electrode 150s and the drain electrode 150d may be in direct contact with a top surface of the protective pattern 142. In addition, according to some embodiments, the source electrode 150s and the drain electrode 150d may be in direct contact with sidewalls of the active pattern 132 disposed at both sides of the gate electrode 110, respectively.

The source electrode 150s and the drain electrode 150d may be formed of at least one of nickel (Ni), chromium (Cr), molybdenum (Mo), aluminum (Al), titanium (Ti), copper (Cu), tungsten (W), or any alloy thereof. The source electrode 150s and the drain electrode 150d may be formed of a single layer or multi-layer using the metal. Alternatively, the source electrode 150s and the drain electrode 150d may be formed of a transparent conductive material.

According to some embodiments of the inventive concepts, the active pattern 132 may have a higher mobility than the protective pattern 142 not including nitrogen due to the reduction in the effective mass by nitrogen included in the active pattern 132, as described above. In addition, the thickness of the protective pattern 142 may be smaller than the thickness of the active pattern 132, as described above.

Thus, a channel of the thin film transistor according to some embodiments of the inventive concepts may be generated in the active pattern 132 having the substantially high mobility. As a result, the thin film transistor with the high mobility may be provided or realized.

In addition, according to some embodiments of the inventive concepts, the protective pattern 142 may be disposed on the active pattern 132 and may be in direct contact with a top surface of the active pattern 132. Thus, it is possible to inhibit or prevent the active pattern 132 from being damaged by a solution used in a process of fabricating the active pattern 132. As a result, deterioration of the active pattern 132 may be prevented to provide or realize a highly reliable thin film transistor.

Unlike the thin film transistor according to the aforementioned embodiments of the inventive concepts, a passivation layer may be provided on the protective pattern and source/drain electrodes may penetrate the passivation layer so as to be connected to the protective pattern in a modified example of some embodiments of the inventive concepts. This will be described with reference to FIG. 1B.

FIG. 1B is a cross-sectional view illustrating a thin film transistor according to a modified example of some embodiments of the inventive concepts.

Referring to FIG. 1B, a thin film transistor according to the modified example may include a substrate 100, a gate electrode 110, a gate insulating layer 120, an active pattern 132, a protective pattern 142, a passivation layer 145, a drain electrode 152d, and a source electrode 152s.

The substrate 100, the gate electrode 110, the gate insulating layer 120, the active pattern 132, and the protective pattern 142 may respectively correspond to the substrate 100, the gate electrode 110, the gate insulating layer 120, the active pattern 132, and the protective pattern 142, which are described with reference to FIG. 1A.

The passivation layer 145 may be disposed on the protective pattern 142. The passivation layer 145 may be formed of silicon oxide, silicon nitride, or silicon oxynitride.

The source electrode 152s may penetrate the passivation layer 145 so as to be connected to a portion of the protective pattern 142 which is adjacent to a side of the gate electrode 110. The drain electrode 152d may penetrate the passivation layer 145 so as to be connected to a portion of the protective pattern 142 which is adjacent to another side of the gate electrode 110. The source electrode 152s and the drain electrode 152d may be in direct contact with the protective pattern 142 but may not be in contact with the active pattern 132. Thus, when the thin film transistor according to the modified example is turned-on, carriers may move between the source electrode 152s and the drain electrode 152d via the protective pattern 142 formed of the semiconductive non-nitride as described with reference to FIG. 1A.

Alternatively, unlike FIG. 1B, the source electrode 152s and the drain electrode 152d may penetrate the protective pattern 142 so as to be in direct contact with the active pattern 132.

Methods of fabricating the thin film transistors according to some embodiments and the modified example of the inventive concepts will be described hereinafter.

FIG. 2 is a flow chart illustrating a method of fabricating a thin film transistor according to some embodiments of the inventive concepts, and FIGS. 3 and 4 are cross-sectional views illustrating a method of fabricating a thin film transistor according to some embodiments of the inventive concepts.

Referring to FIGS. 2 and 3, a gate electrode 110 may be formed on a substrate 100 (S110). The substrate 100 may be a glass substrate, a plastic substrate, or semiconductor substrate, as described with reference to FIG. 1A. A gate insulating layer 120 may be formed on the gate electrode 110 (S120).

An active layer 130 may be formed on the gate insulating layer 120 (S130). The active layer 130 may include a nitride. In some embodiments, the active layer 130 may be formed of a compound including a first element, a second element, and nitrogen, as described with reference to FIG. 1A. In this case, forming the active layer 130 may include preparing a first source including the first element, a second source including the second element, and a third source including nitrogen, and depositing the active layer 130 on the gate insulating layer 120 by using the first to third sources.

A protective layer 140 may be formed on the active layer 130 (S140). The protective layer 140 may include a non-nitride. In the event that the active layer 130 is formed using the first to third sources as described above, the protective layer 140 may be formed using the first source and the second source used in the formation of the active layer 130 by the same formation method as the active layer 130. For example, in the event that the active layer 130 is formed by a chemical vapor deposition (CVD) method using a source including zinc, a source including oxygen, and a source including nitrogen, the protective layer 140 may be formed by a CVD method using the source including zinc and the source including oxygen. Thus, kinds of the sources for forming the active layer 130 and the protective layer 140 may be reduced. As a result, the sources may be easily managed, process efficiency may be improved, and a fabrication cost may be reduced.

Referring to FIGS. 2 and 4, the protective layer 140 and the active layer 130 may be sequentially patterned to form an active pattern 132 and a protective pattern 142 on the active pattern 132 (S150). The protective layer 140 and the active layer 130 may be patterned at the same time, and thus a width of the active pattern 132 may be substantially equal to a width of the protective pattern 142. In addition, sidewalls of the active pattern 132 may be substantially coplanar with sidewalls of the protective pattern 142.

The protective layer 140 may protect the active layer 130 from a solution process for patterning the active layer 130. For example, when a photoresist pattern is formed on the protective layer 140, the protective layer 140 may prevent the active layer 130 from being damaged by a solution process (or a solution) for developing the photoresist pattern. For another example, when the protective layer 140 and the active layer 130 are patterned using the photoresist pattern, the protective layer 140 may prevent the active layer 130 from being over-etched by a solution process (or a solution) for etching the protective layer 140 and/or the active layer 130. Thus, characteristics and a fabrication yield of the active pattern 132 may be improved, and it may be easy to form the active pattern 132 having a relatively fine size.

If the protective layer 140 is omitted, the active layer 130 may be damaged by the solution process for developing the photoresist pattern and/or the solution process for etching the active layer 130. Thus, characteristics and a fabrication yield of the active pattern may be deteriorated, and it may be difficult to form an active pattern having a relatively fine size.

However, according to the aforementioned embodiments of the inventive concepts, the protective layer 140 may protect the active layer 130 from the solution process for patterning the active layer 130. Thus, a highly reliable and highly integrated thin film transistor may be fabricated.

Referring to FIGS. 1A and 2, a source/drain electrode layer may be formed on the active pattern 132 and the protective pattern 142. The source/drain electrode layer may be patterned to form a source electrode 150s and a drain electrode 150d which are in contact with portions of the protective pattern 142 at both sides of the gate electrode 110, respectively (S160).

A method of fabricating the thin film transistor according to the modified example will be described hereinafter.

Referring to FIG. 1B, a gate electrode 110 on a substrate 100, a gate insulating layer 120 on the gate electrode 110, an active pattern 132 on the gate insulating layer 120, and a protective pattern 142 on the active pattern 132 may be sequentially formed by the method described above with reference to FIGS. 3 and 4.

A passivation layer 145 may be formed on the protective pattern 142. The passivation layer 145 may be patterned to form openings exposing portions of the protective pattern 142 at both sides of the gate electrode 110. A source/drain electrode layer may be formed to fill the openings, and then, the source/drain electrode layer may be patterned to form a source electrode 152s and a drain electrode 152d.

Unlike the aforementioned embodiments and modified example of the inventive concepts, a gate electrode may be disposed on an active pattern in other embodiments of the inventive concepts. This will be described with reference to FIGS. 5 to 8.

FIG. 5 is a cross-sectional view illustrating a thin film transistor according to other embodiments of the inventive concepts.

Referring to FIG. 5, a thin film transistor according to other embodiments of the inventive concepts may include an active pattern 212, a protective pattern 222, a gate insulating layer 230, a gate electrode 240, a passivation layer 250, a source electrode 260s, and a drain electrode 260d, which are disposed on a substrate 200.

The substrate 200 may be the substrate 100 described with reference to FIG. 1A.

The active pattern 212 may be formed of a nitride, like the active pattern 132 described with reference to FIG. 1A. For example, the active pattern 212 may include at least one of ZnON, SnON, InON, or TiON.

The protective pattern 222 may be disposed on the active pattern 212. The protective pattern 222 may be formed of a semiconductive non-nitride, like the protective pattern 142 described with reference to FIG. 1A. For example, in the event that the active pattern 212 includes ZnON, the protective pattern 222 may include ZnO. A thickness of the protective pattern 222 may be smaller than a thickness of the active pattern 212.

The gate insulating layer 230 may cover the active pattern 212 and the protective pattern 222. The gate insulating layer 230 may be formed of the same material as the gate insulating layer 120 described with reference to FIG. 1A.

The gate electrode 240 may be disposed on the gate insulating layer 230 and may overlap with the active pattern 212. The gate electrode 240 may be formed of the same material as the gate electrode 110 described with reference to FIG. 1A.

The passivation layer 250 may be disposed on the gate electrode 240. The passivation layer 250 may be formed of an insulating material (e.g., silicon oxide, silicon nitride, or silicon oxynitride).

The source electrode 260s may penetrate the passivation layer 250 so as to be connected to a portion of the protective pattern 222 which is adjacent to a side of the gate electrode 240. The drain electrode 260d may penetrate the passivation layer 250 so as to be connected to a portion of the protective pattern 222 which is adjacent to another side of the gate electrode 240. In some embodiments, the source electrode 260s and the drain electrode 260d may be in direct contact with a top surface of the protective pattern 222 but may not be in contact with the active pattern 212. Alternatively, unlike FIG. 5, the source electrode 260s and the drain electrode 260d may penetrate the protective pattern 222 so as to be in direct contact with portions of the active pattern 212 at both sides of the gate electrode 240.

A method of fabricating the thin film transistor according to other embodiments of the inventive concepts will be described hereinafter.

FIG. 6 is a flow chart illustrating a method of fabricating a thin film transistor according to other embodiments of the inventive concepts, and FIGS. 7 and 8 are cross-sectional views illustrating a method of fabricating a thin film transistor according to other embodiments of the inventive concepts.

Referring to FIGS. 6 and 7, an active layer 210 including a nitride may be formed on a substrate 200 (S210). The active layer 210 may be formed by the same method as the active layer 130 described with reference to FIGS. 2 and 3.

A protective layer 220 including a non-nitride may be formed on the active layer 210 (S220). The protective layer 220 may be formed by the same method as the protective layer 140 described with reference to FIGS. 2 and 3.

Referring to FIGS. 6 and 8, the protective layer 220 and the active layer 210 may be sequentially patterned to form an active pattern 212 and a protective pattern 222 on the active pattern 212 (S230). The protective layer 220 and the active layer 210 may be patterned by the same method as the method of patterning the protective layer 140 and the active layer 130 described with reference to FIGS. 2 and 4. The protective layer 220 may protect the active layer 210 from a solution process for patterning the active layer 210, as described with reference to FIGS. 2 and 4.

Referring to FIGS. 5 and 6, a gate insulating layer 230 may be formed to cover the protective pattern 222 and the active pattern 212 (S240). A gate electrode 240 may be formed on the gate insulating layer 230 to overlap with the active pattern 212 (S250).

A passivation layer 250 may be formed on the gate electrode 240, and then, a source electrode 260s and a drain electrode 260d may be formed (S260). The source electrode 260s and the drain electrode 260d may penetrate the passivation layer 250 so as to be connected to portions of the protective pattern 222 at both sides of the gate electrode 240, respectively.

Evaluation results of characteristics of the thin film transistor according to embodiments of the inventive concepts will be described hereinafter.

FIG. 9 is a graph illustrating a current-voltage characteristic of a thin film transistor according to embodiments of the inventive concepts, and FIG. 10 is a graph illustrating a mobility of a thin film transistor according to embodiments of the inventive concepts.

Referring to FIGS. 9 and 10, a thin film transistor according to embodiments of the inventive concepts was fabricated using an active pattern including ZnON and a protective pattern including ZnO on the ZnON active pattern. As a result of measurement, the thin film transistor had a threshold voltage of −2.8V, a saturation mobility of 49cm$^2$/Vs, and a sub-threshold voltage swing of 0.55V/decade. In other words, the thin film transistor having high reliability and high mobility may be provided or realized using the active pattern including the nitride and the protective pattern including the non-nitride.

The thin film transistor according to the aforementioned embodiments of the inventive concepts may be used in a display device. A display device including the thin film transistor according to the aforementioned embodiments and/or the thin film transistor fabricated by the fabricating method according to the aforementioned embodiments will be described hereinafter.

FIG. 11 is a schematic block diagram illustrating a display device including a thin film transistor according to embodiments of the inventive concepts.

Referring to FIG. 11, a display device including an organic light-emitting device according to some embodiments of the inventive concepts may include a display unit 300, a timing controller 310, a gate driving unit 330, a data driving unit 340, and a power supply unit 350.

The display unit 300 may include gate lines, data lines crossing the gate lines, and pixel cells formed in crossing areas of the gate lines and the data lines.

The pixel cell may include at least one of the thin film transistors according to the aforementioned embodiments of the inventive concepts. The pixel cell may also include an organic light-emitting diode or a liquid crystal layer. The thin film transistor of the aforementioned embodiments, which is included in the pixel cell, may be provided as a PMOS transistor or an NMOS transistor.

The gate line may supply a gate signal GS, which is supplied from the gate driving unit 330, to the pixel cell. The thin film transistor according to the inventive concepts, which is included in the pixel cell, may be turned-on in response to the gate signal GS. The data line may supply a display data voltage DDV, which is supplied from the data driving unit 340, to the pixel cell.

The timing controller 310 may receive a data signal I-DATA from an external system and may supply the data signal I-DATA to the data driving unit 340. In addition, on the basis of a signal supplied from the external system, the timing controller 310 may provide a gate control signal GCS and a data control signal DCS to the gate driving unit 330 and the data driving unit 340, respectively.

The power supply unit 350 may supply a gate-on-voltage VON/a gate-off-voltage VOFF to the gate driving unit 330 and may supply an analog driving voltage AVDD to the data driving unit 340. In addition, the power supply unit 350 may supply a driving voltage VDD and a common voltage Vcom to the display unit 300.

The thin film transistor according to embodiments of the inventive concepts is used in the display device in FIG. 11. However, embodiments of the inventive concepts are not limited thereto. The thin film transistor according to embodiments of the inventive concepts may be used in other various electronic devices.

The thin film transistor according to embodiments of the inventive concepts and the thin film transistor fabricated by the fabricating method according to embodiments of the inventive concepts may be applied to various electronic devices such as televisions, smart phones, tablet personal computers, and wearable devices.

The thin film transistor according to embodiments of the inventive concepts may include the active pattern including the nitride and the protective pattern including the non-nitride on the active pattern. The protective pattern may protect the active pattern from the solution used in the process of forming the active pattern, and the mobility may be improved by nitrogen included in the active pattern. Thus, the thin film transistor having the high reliability and the high mobility may be provided or realized.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A thin film transistor comprising:
a substrate;
an active pattern, formed of ZnON, disposed on the substrate;
a protective pattern, formed of ZnO, directly disposed on the active pattern;
a gate electrode overlapping with the active pattern; and
a gate insulating layer, at least one portion of the gate insulating layer in a length direction being disposed between the gate electrode and the active pattern,
wherein the active pattern includes a channel therein.

2. The thin film transistor of claim 1, wherein the protective pattern is formed of a semiconductive non-nitride, and
wherein the active pattern has a higher mobility than the protective pattern.

3. The thin film transistor of claim 1, further comprising:
a passivation layer covering the protective pattern;
a source electrode penetrating the passivation layer so as to be in contact with a portion of the protective pattern adjacent to a side of the gate electrode; and
a drain electrode penetrating the passivation layer so as to be in contact with a portion of the protective pattern adjacent to another side of the gate electrode.

4. The thin film transistor of claim 1, further comprising:
a source electrode at a side of the gate electrode; and
a drain electrode at another side of the gate electrode,
wherein the source electrode and the drain electrode are in contact with portions of the protective pattern adjacent to the side and the another side of the gate electrode, respectively.

5. The thin film transistor of claim 1, wherein the active pattern is disposed between the protective pattern and the gate electrode.

6. The thin film transistor of claim 1, wherein the protective pattern is disposed between the active pattern and the gate electrode.

7. The thin film transistor of claim 1, wherein a thickness of the protective pattern is smaller than a thickness of the active pattern.

8. The thin film transistor of claim 1, wherein the protective pattern is in direct contact with the active pattern.

* * * * *